United States Patent
Babaie et al.

(10) Patent No.: US 9,634,610 B2
(45) Date of Patent: Apr. 25, 2017

(54) 60 GHZ WIDEBAND CLASS E/F$_2$ POWER AMPLIFIER

(71) Applicants: Masoud Babaie, Pijnacker (NL); Robert Bogdan Staszewski, Dublin (IE)

(72) Inventors: Masoud Babaie, Pijnacker (NL); Robert Bogdan Staszewski, Dublin (IE)

(73) Assignee: Short Circut Technologies LLC, Rochester, NY (US)

( * ) Notice: Subject to any disclaimer, the term of this patent is extended or adjusted under 35 U.S.C. 154(b) by 94 days.

(21) Appl. No.: 14/874,427

(22) Filed: Oct. 3, 2015

(65) Prior Publication Data
US 2016/0099685 A1 Apr. 7, 2016

Related U.S. Application Data

(60) Provisional application No. 62/059,448, filed on Oct. 3, 2014.

(51) Int. Cl.
*H03F 3/60* (2006.01)
*H03F 1/02* (2006.01)
(Continued)

(52) U.S. Cl.
CPC ....... *H03F 1/0205* (2013.01); *H01F 27/2823* (2013.01); *H01F 27/29* (2013.01);
(Continued)

(58) Field of Classification Search
CPC ........................................................ H03F 3/60
(Continued)

(56) References Cited

U.S. PATENT DOCUMENTS 3,319,149 A 5/1967 Start
3,801,871 A * 4/1974 Loh .................. H02H 1/003
361/113

(Continued)

FOREIGN PATENT DOCUMENTS

EP 1677415 7/2006

OTHER PUBLICATIONS

International Search Report, PCT/US2015/053900, Feb. 4, 2016.
(Continued)

*Primary Examiner* — Patricia T Nguyen
(74) *Attorney, Agent, or Firm* — Zaretsky Group PC; Howard Zaretsky

(57) ABSTRACT

A novel and useful fully integrated switched-mode wideband 60 GHz power amplifier architecture. Using an appropriate second-harmonic termination of its output matching network, the required systematic peak current of the final stage is reduced such that the PA functions as a class-E/F$_2$ switched-mode PA at saturation. In addition, low/moderate magnetic coupling factor transformers in the intermediate stages enable the PA to reach a high power added efficiency (PAE) and bandwidth product. Transformers of low/moderate coupling are also utilized in the preliminary stages of the PA to improve the overall bandwidth. In addition, the PA exploits the different behavior of the output impedance matching network for differential mode (DM) and common mode (CM) excitations. The PA is also stabilized against the combination of DM and CM oscillation modes. The PA also provides a technique to stabilize transformer-based mm-wave amplifiers against various modes of undesired oscillations.

16 Claims, 12 Drawing Sheets

(51) Int. Cl.

| | |
|---|---|
| *H01F 27/28* | (2006.01) |
| *H03F 1/56* | (2006.01) |
| *H03F 3/193* | (2006.01) |
| *H03F 3/21* | (2006.01) |
| *H03F 3/217* | (2006.01) |
| *H03H 7/38* | (2006.01) |
| *H01F 27/29* | (2006.01) |
| *H01Q 1/50* | (2006.01) |
| *H03H 7/40* | (2006.01) |
| *H03F 3/24* | (2006.01) |

(52) U.S. Cl.
CPC ............... *H01Q 1/50* (2013.01); *H03F 1/565* (2013.01); *H03F 3/193* (2013.01); *H03F 3/211* (2013.01); *H03F 3/2171* (2013.01); *H03F 3/2176* (2013.01); *H03F 3/245* (2013.01); *H03H 7/38* (2013.01); *H03H 7/40* (2013.01); *H03F 2200/318* (2013.01); *H03F 2200/451* (2013.01); *H03F 2200/534* (2013.01); *H03F 2200/537* (2013.01); *H03F 2200/541* (2013.01); *H03F 2203/21106* (2013.01); *H03F 2203/21139* (2013.01)

(58) Field of Classification Search
USPC .................................. 330/251, 53, 188, 195
See application file for complete search history.

(56) References Cited

U.S. PATENT DOCUMENTS

| | | | | |
|---|---|---|---|---|
| 6,026,286 | A * | 2/2000 | Long .................... | H03D 7/1433 455/319 |
| 2002/0101284 | A1 | 8/2002 | Kee et al. | |
| 2006/0146691 | A1 | 7/2006 | Koukkari | |
| 2007/0041226 | A1* | 2/2007 | Powers ............. | H02M 3/33561 363/21.12 |
| 2009/0174477 | A1* | 7/2009 | Lee .................... | H01F 27/2804 330/195 |
| 2014/0085012 | A1 | 3/2014 | Wu et al. | |

OTHER PUBLICATIONS

Written Opinion of the International Searching Authority, PCT/US2015/053900, Feb. 4, 2016.
Kluge, W. et al., "A Fully Integrated 2.4GHz IEEE 802.15.4 Compliant Transceiver for ZigBee Applications", ISSCC 2006, pp. 1470-1479, 2006.
Cook, B.W. et al.,"An ULP 2.4GHz RF Transceiver for Wireless Sensor Networks in 0.13 μm CMOS with 400mV Supply and an Integrated Passive RX Front-End", ISSCC,pp. 1460-1469,2006.
Cook, B.W. et al.,"Low-Power 2.4-GHz Transceiver With Passive RX Front-End and 400-mV Supply", IEEE JSSC, vol. 41, No. 12, pp. 2757-2766, Dec. 2006.
Stanic', N. et al., "A 2.4-GHz ISM-Band Sliding-IF Receiver With a 0.5-V Supply", IEEE JSSC, vol. 43, No. 5, pp. 1138-1145, May 2008.
Retz, G. et al., "A Highly Integrated Low Power 2.4GHz Transcevier Using a Direct Conversion Diversity Receiver in 0.18 μm CMOS for IEEE802.15.4 WPAN", ISSCC,Slide Deck, 2009.
Retz, G. et al., "A Highly Integrated Low Power 2.4GHz Transcevier Using a Direct Conversion Diversity Receiver in 0.18 μm CMOS for IEEE802.15.4 WPAN", ISSCC,pp. 414-415, 2009.
Balankutty, A. et al.,"A 0.6-V Zero-IF/Low-IF Receiver With Integrated Fractional-N Synthesizer for 2.4-GHz ISM-Band Applications",IEEE JSSC,vol. 45,No. 3,pp. 538-553, Mar. 2010.
Liu, Y.H. et al., "A 2.7nJ/b Multi-Standard 2.3/2.4GHz Polar Transmitter for Wireless Sensor Networks", ISSCC 2012, pp. 448-449, 2012.
Wong, A. et al., "A 1V 5mA Multimode IEEE 802.15.6/Bluetooth Low-Energy WBAN Transceiver for Biotelemetry Applications", ISSCC 2012, pp. 300-301, 2012.
Lin, C.Y. et al., "An Energy-Efficient 2.4-GHz PSK/16-QAM Transmitter", IEEE Asian SSCC, 361-364, Nov. 2012.
Liu, C.Y. et al., "An Energy-Efficient Polar Transmitter for IEEE 802.15.6 Body Area Networks: System Requirements and Circuit Designs",IEEE Comm Magazine,pp. 118-127,Oct. 2012.
Wong, A.C.W. et al., "A 1 V 5 mA Multimode IEEE 802.15.6/Bluetooth Low-Energy WBAN Transceiver for Biotelemetry Applications", IEEE JSSC, vol. 48. No. 1, pp. 186-198, Jan. 2013.
Zhang, F. et al., "A 1.6mW 300mV-Supply 2.4GHz Receiver with -94dBm Sensitivity for Energy-Harvesting Applications", ISSCC 2013, pp. 456-457, 2013.
Li, Y.H. et al., "A 1.9nJ/b 2.4GHz Multistandard (Bluetooth Low Energy/Zigbee/IEEE802.15.6) Transceiver for Personal/Body-Area Networks", ISSCC 2013, pp. 446-447, 2013.
Zhang, F. et al., "Design of a 300-mV 2.4-GHz Receiver Using Transformer-Coupled Techniques", IEEE JSSC, vol. 48, No. 12, pp. 3190-3205, Dec. 2013.
Wang, K. et al., "A 1.8mW PLL-Free Channelized 2.4GHz ZigBee Receiver Utilizing Fixed-LO Temperature-Compensated FBAR Resonator", ISSCC 2014, pp. 372-373, 2014.
Li, Y. et al., "A 0.65V 1.2mW 2.4GHz/400MHz Dual-Mode Phase Modulator for Mobile Healthcare Applications", IEEE Asian SSCC, pp. 261-264, Nov. 2014.
Silver, J. et al., "An Ultra-Low-Voltage All-Digital PLL for Energy Harvesting Applications", ESSCIRC 2014, pp. 91-94, 2014.
Devita, G. et al., "A 5mW multi-standard Bluetooth LE/IEEE 802.15.6 SoC for WBAN applications", ESSCIRC 2014, pp. 283-286, 2014.
Prummel, J. et al., "A 10mW Bluetooth Low-Energy Transceiver with On-Chip Matching", ISSCC 2015, pp. 238-239, 2015.
Sano, T. et al., "A 6.3mW BLE Transceiver Embedded RX Image-Rejection Filter and TX Harmonic-Suppression Filter Reusing On-Chip Matching Network", ISSCC, pp. 240-241, 2015.
"Single-chip Bluetooth low energy solution", Nordic Semiconductor nRF8001 Product Specification 1.0, Jan. 2012.
Klumperink, E.A.M. et al., "Reducing MOSFET 1/f Noise and Power Consumption by Switched Biasing," IEEE J. Solid-State Circuits, vol. 35, No. 7, pp. 994-1001, Jul. 2000.
Lee, T. et al., "Oscillator Phase Noise: A tutorial," IEEE J. Solid State Circuits, vol. 35, No. 2, pp. 326-336, Mar. 2000.
Chillara,V.K. et al.,"An 860 μW 2.1-to-2.7GHz All-Dig PLL-Based Freq Mod with a DTC-Assisted Snapshot TDC for WPAN (Bluetooth Smart and Zigbee) Appls",ISSCC,pp. 172-173,Feb. 2014.
Kee, S.D. et al., "The class-E/F family of switching amplifiers", IEEE Trans Microwave Theory and Techniques, vol. 51, No. 6, pp. 1677-1690, Jun. 2003.
Chen, J. et al., "A digitally modulated mm-Wave cartesian beamforming transmitter with quadrature spatial combining", ISSCC 2013, pp. 232-233, Feb. 2013.
Kuo, F.W. et al., "A 12mW all-digital PLL based on class-F DCO for 4G phones in 28nm CMOS," IEEE VLSI Circ. Symp., pp. 1-2, 2014.

* cited by examiner

60 GHZ WIDEBAND CLASS E/F$_2$ POWER AMPLIFIER

REFERENCE TO PRIORITY APPLICATION

This application claims priority to U.S. Provisional Application Ser. No. 62/059,448, filed Oct. 3, 2014, entitled "Power Amplifier," incorporated herein by reference in its entirety.

FIELD OF THE INVENTION

The present invention relates generally to amplifier circuits and in particular to a 60 GHz wideband class E/F$_2$ power amplifier.

BACKGROUND OF THE INVENTION

Radio frequency (RF) power amplifier is a key component of radios that functions to convert a low power RF signal into a larger signal having significant power for driving, for example, the antenna of a transmitter. As more and more of the radio processing chain goes digital, there is currently great effort to digitize and integrate the PA, which traditionally was implemented off-chip with discrete analog components.

Considering digital radios, a key technical challenge of 60 GHz CMOS radios is poor efficiency of their power amplifier (PA). By using advanced digitally intensive transmitter architectures, such as outphasing and direct digital-to-RF conversion, a nonlinear switch-mode PA can be used to improve the total system efficiency. Switching power amplifiers, however, are rarely seen at mm-wave frequencies due to the large output capacitance and low current capability of CMOS transistors. In a prior art power amplifier, a two-turn inductor is exploited to realize a switch-mode PA at 60 GHz. This inductor, however, must be large enough to simultaneously satisfy the required reactance for both fundamental and second harmonics. Consequently, its relatively large inductance limits the output transistor size so the PA output power (Pout) is less than 10 dBm.

There is thus a need for a power amplifier that is suitable for integration with mm-wave 60 GHz CMOS based radios having wide bandwidth and high efficiency and generates sufficient output power.

SUMMARY OF THE INVENTION

The present invention is a novel architecture for a fully integrated switched-mode wideband 60 GHz power amplifier. Using an appropriate second-harmonic termination of its output matching network, the required systematic peak current of the final stage is reduced such that the PA functions as a class-E/F$_2$ switched-mode PA at saturation. Transformers of low/moderate coupling are also utilized in the preliminary stages of the PA to improve the overall bandwidth. In addition, the PA exploits the different behavior of the output impedance matching network for differential mode (DM) and common mode (CM) excitations.

The PA utilizes a proper second-harmonic termination in the last stage and low/moderate magnetic coupling factor transformers in the intermediate stages to reach the best product of power added efficiency (PAE) and bandwidth. The PA is also stabilized against the combination of DM and CM oscillation modes. The invention also provides a technique to stabilize transformer-based mm-wave amplifiers against various modes of undesired oscillations. The power amplifier has been fabricated in standard digital 40 nm CMOS having 17.9 dBm P$_{sat}$. The PA can be incorporated within a wide range of applications including, for example, mobile devices.

There is thus provided in accordance with the invention, a radio frequency (RF) signal splitter, comprising a transformer having a primary winding coupled to a differential input signal source, a first secondary winding configured to generate a first differential output signal, a second secondary winding configured to generate a second differential output signal, and a cross-connect configured to couple the first secondary winding to the second secondary winding.

There is also provided in accordance with the invention, a radio frequency (RF) signal splitter, comprising a transformer having a primary winding coupled to a differential input signal source, a first secondary winding configured to generate a first differential output signal having a first polarity port and an opposite second polarity port, a second secondary winding configured to generate a second differential output signal having a first polarity port and an opposite second polarity port, a cross-connection configured to couple the first polarity port of the first secondary winding to the first polarity port of the second secondary winding, and to couple the second polarity port of the first secondary winding to the second polarity port of the second secondary winding, wherein the cross-connection is operative to dampen combined common mode and differential mode oscillations present on the first and second secondary windings.

There is further provided in accordance with the invention, a class E/F$_2$ power amplifier, comprising one or more switch transistors, a signal splitter including a first transformer, the first transformer comprising a primary winding coupled to a differential input signal source, a first secondary winding configured to generate a first differential output signal, a second secondary winding configured to generate a second differential output signal, a cross-connect configured to couple the first secondary winding to the second secondary winding, an impedance matching network coupled to an output of the splitter, the impedance matching network comprising a second transformer, the second transformer comprising a primary winding having a first inductance, a secondary winding having a second inductance, wherein the secondary inductance and its associated capacitance are configured to resonate at a fundamental frequency, and wherein exciting the primary winding with a common mode signal at a second harmonic frequency causes substantially no current to be induced on the secondary winding.

BRIEF DESCRIPTION OF THE DRAWINGS

The invention is herein described, by way of example only, with reference to the accompanying drawings, wherein.

DETAILED DESCRIPTION OF THE INVENTION

Benefits and Constraints of Class-E/F Power Amplifier

Figure 1:
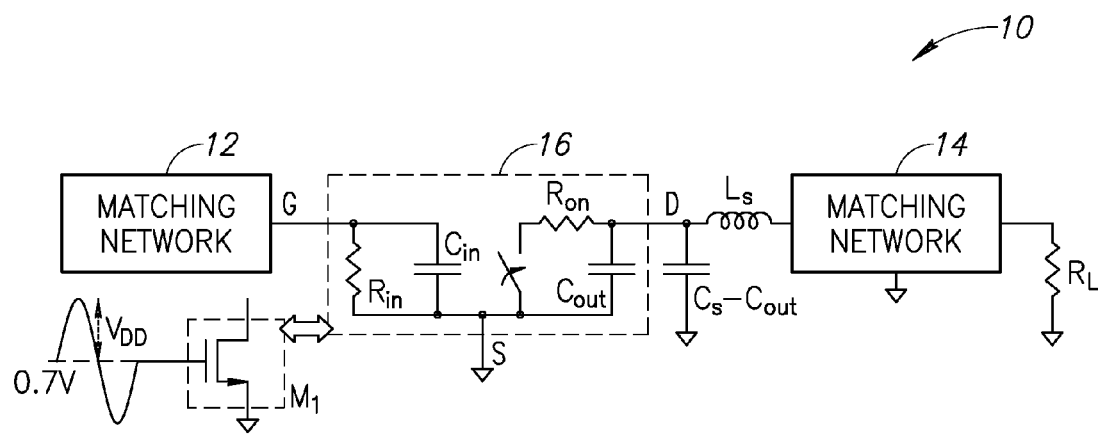
FIG. 1 is a high level schematic of an example switched-mode power amplifier.

A high level schematic of an example class-E/F power amplifier is shown in FIG. 1. The circuit, generally referenced 10, comprises an input matching network 12, switch transistor $M_1$ (modeled as equivalent circuit 16, capacitor $C_S$-$C_{out}$, inductor $L_S$ and matching network 14 connected to the antenna load $R_L$.

It can be shown that the drain efficiency $\eta_D$ of zero-voltage switching (ZVS) PA 10 can be written in terms of a set of technology dependent parameters ($R_{on}$, $C_{out}$) and a set of matching network or waveform dependent parameters ($F_C$, $F_{PI}$, $F_I$). Equation 1 below can be used to better understand the tradeoffs in mm-wave designs:

$$\eta_D = 1 - \frac{R_{on}I_{rms}^2}{V_{DD}I_{DC}} = \qquad (1)$$

$$1 - \left(\frac{I_{rms}}{I_{DC}}\right)^2 \frac{I_{DC}}{C_S\omega_0(V_{DD}-V_{sat})} \cdot \left(\frac{V_{DD}-V_{sat}}{V_{DD}}\right)\left(\frac{C_S}{C_{out}}\right)(R_{on}C_{out})\omega_0.$$

The waveform figures of merit (FoM) are defined as the following:

$$F_I = \frac{I_{rms}}{I_{DC}}, \qquad (2)$$

$$F_C = \frac{I_{DC}}{C_S\omega_0(V_{DD}-V_{sat})}, \qquad (3)$$

$$F_{PI} = \frac{I_{peak}}{I_{DC}}. \qquad (4)$$

Where $R_{on}$ and $C_{out}$ are the on-state channel resistance and off-state output capacitance of transistor $M_1$, respectively. Note that $R_{on} \times C_{out}$ is invariant to changes in the width of transistor $M_1$. $I_{DC}$ and $I_{rms}$ are defined as the average and RMS values of $M_1$ drain current, and $C_S$ is the PA desired shunt capacitance to satisfy the ZVS criterion. $V_{sat}$ represents the transistor's average $V_{DS}$ in the on-state. Note that since $F_C$ should not change over the $\omega_0=2\pi f_0$ operating frequency, $C_S$ has to reduce with increasing $f_0$. Thus, $C_S$ limits the width of the transistor at mm-wave, which leads to a dramatic increase in $R_{on}$ and thus $V_{sat}$ of the switching device. Consequently, we include the effect of $V_{sat}$ in $\eta_D$ and $F_C$ definitions in Equations 1, 2, 3 and 4 to achieve better practical analytic results. $V_{sat}$ can be calculated from the following:

$$P_{Loss}=V_{sat}I_{DC}=R_{on}I_{rms}^2 \rightarrow V_{sat}=R_{on}I_{DC}F_I^2 \qquad (5)$$

By replacing $I_{DC}=F_C C_S \omega_0(V_{DD}-V_{sat})$ in Equation 5, $$V_{sat} = V_{DD}\frac{F_C F_I^2 R_{on}C_{out}\omega_0}{\alpha + F_C F_I^2 R_{on}C_{out}\omega_0} \qquad (6)$$

where $\alpha=C_{out}/C_S$ denotes how much the required $C_S$ for class-E/F operation is occupied by the self-capacitance of transistor $M_1$. It is also instructive to go a step further and calculate the class-E/F PA characteristics based on waveform parameters and technology parameters shown in Tables 1 and 2, respectively, below.

TABLE 1

Waveform Parameters

|  | E | E/F$_2$ | E/F$_3$ | E/F$_{2,3}$ | E/F$_4$ | E/F$_{2,4}$ |
|---|---|---|---|---|---|---|
| F$_C$ | 3.14 | 1.13 | 3.14 | 2.31 | 2.45 | 0.97 |
| F$_I$ | 1.54 | 1.48 | 1.52 | 1.47 | 1.55 | 1.46 |
| F$_{PI}$ | 2.86 | 3.33 | 3.06 | 2.67 | 3.27 | 3.6 |

TABLE 2

Technology Parameters

| R$_{in}$ | C$_{in}$ | R$_{on}$ | C$_{out}$ | I$_{out}$ |
|---|---|---|---|---|
| 27 kΩ/μm | 1 fF/μm | 850 Ω/μm | 0.6 fF/μm | 0.55 mA/μm |

MOS devices must satisfy two conditions for proper switched-mode PA operation. First, the transistor cut-off frequency $f_{max}$ should be at least three to four times higher than $f_0$. For example, NMOS $f_{max}$ is about 250 GHz in 40-nm CMOS. Therefore, the transistors should be fast enough to turn on/off rapidly at $f_0$=60 GHz. Second, the transistor must be capable of providing the required systematic peak current during switching while its output capacitance $C_{out}$ remains below $C_S$. Consequently, the output current $I_{out}$ can be expressed as follows:

$$I_{out} = J_{out} \cdot W = \overline{I_{out}} \cdot \frac{C_{out}}{\overline{C_{out}}} \geq I_{peak} \quad (7)$$

Indeed, MOS transistor current capability ($I_{out}/C_{out}$) is relatively poor and puts a limit on the maximum operating frequency $f_m$ of switched-mode PAs. By using Equation 5, $F_{PI}$ and $F_C$ definitions in Equation 7, $f_m$ could be derived as follows:

$$f_m = \frac{\alpha}{2\pi} \frac{\overline{I_{out}}}{\overline{C_{out}}} \frac{1}{F_C(F_{PI}V_{DD} - F_I^2 R_{on} I_{out})} \quad (8)$$

Figure 2:
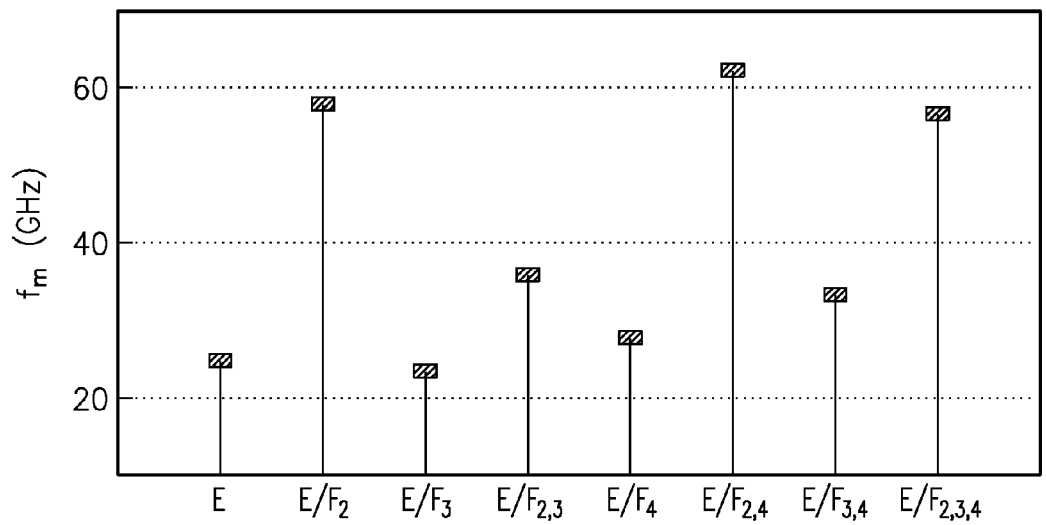
FIG. 2 is a graph illustrating maximum operating frequency for different flavors of switched-mode power amplifiers.

The $f_m$ can be increased by migrating to a more advanced technology or by using a matching network with lower $F_{PI}$ and $F_C$. FIG. 2 predicts $f_m$ for different flavors of class-E/F PA by utilizing Equation 8 and waveform and technology parameters of Tables 1 and 2. FIG. 2 indicates $f_m$ can be extended to 60 GHz in 40 nm CMOS for class-E/F$_2$ operation when the effective load of the transistor is realized as an open circuit at the second harmonic $2\omega_0$.

By substituting Equation 6 into Equation 1, $\eta_D$ is simplified to the following:

$$\eta_D = \frac{\alpha}{\alpha + F_C F_I^2 R_{on} C_{out} \omega_0} \quad (9)$$

Equations 6 and 9 indicate that $V_{sat}$ and $\eta_D$ improve by using a matching network with lower $F_I$ and $F_C$, which is in line with $f_m$ optimization. Equation 9 also predicts $\eta_D=65\%$ for a 40 nm class-E/F$_2$ PA at 60 GHz. The switch size is relatively small such that its $R_{on}$ degrades $\eta_D$ to somewhere between class-A and B. It can be shown that the output power $P_{out}$ of the PA can be calculated as follows:

$$P_{out} = \eta_D P_{DC} = \left(\frac{\alpha V_{DD}}{\alpha + F_C F_I^2 R_{on} C_{out} \omega_0}\right)^2 F_C C_S \omega_0. \quad (10)$$

The gain $G_p$ of the PA can be calculated as follows:

$$G_p = \frac{P_{out}}{V_{DD}^2/2R_{in}} = \frac{2\alpha F_c \overline{R_{in} C_{out}} \omega_0}{(\alpha + F_C F_I^2 R_{on} C_{out} \omega_0)^2} \quad (11)$$

Unfortunately, both the output power $P_{out}$ and gain $G_p$ reduce almost linearly with $F_C$. Consequently, a higher $f_m$ of class-E/F$_2$ operation is achieved through painful reduction of $P_{out}$ and precious device $G_p$, which can potentially reduce the total PAE.

Power Amplifier Embodiment

Figure 3:
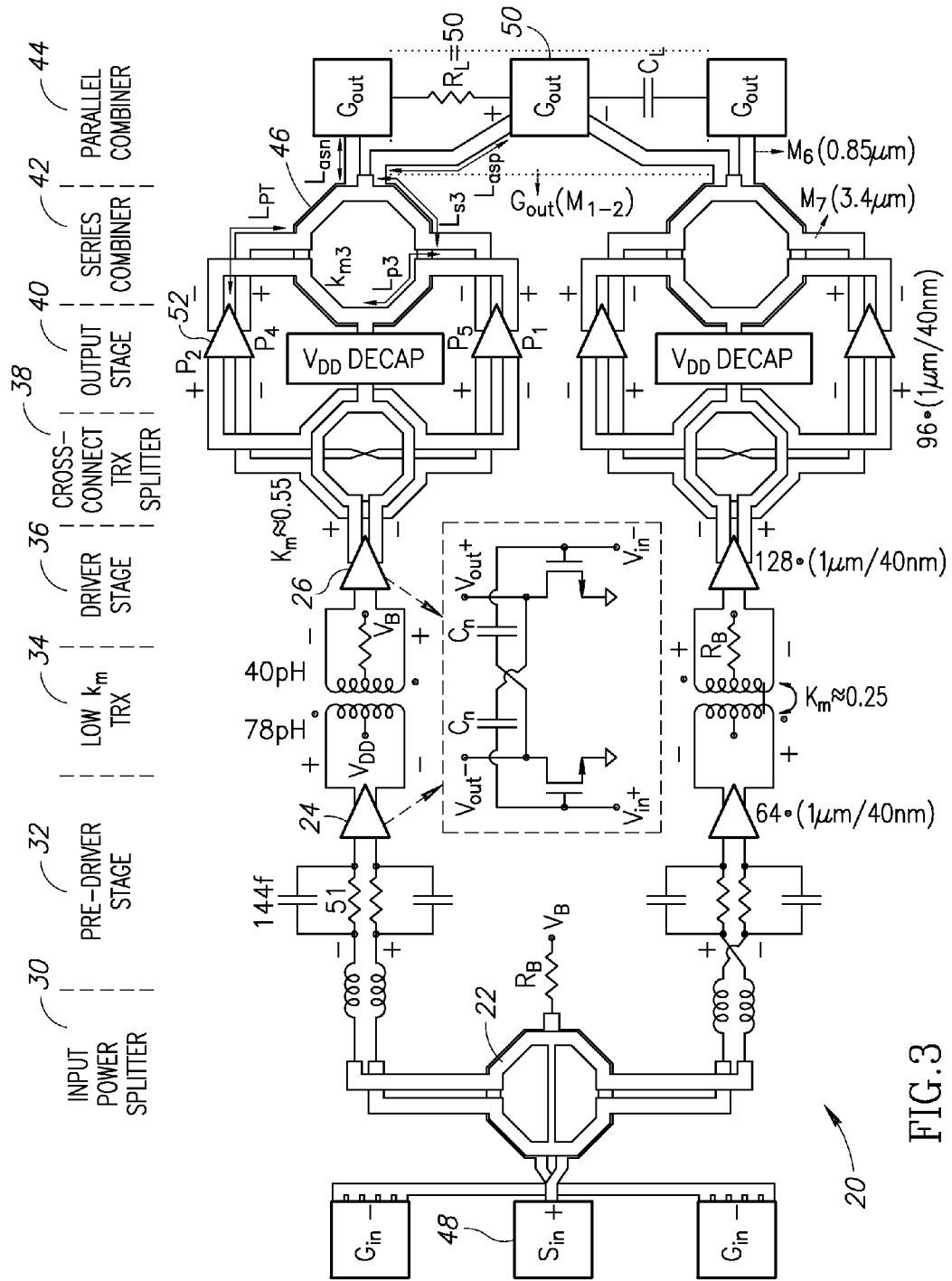
FIG. 3 is a diagram illustrating the schematic and layout of an example 60 GHz power amplifier of the present invention.

A high level schematic diagram illustrating an example power amplifier of the present invention is shown in FIG. 3. The circuit, generally referenced 20, comprises several sections including an input power splitter 30, pre-driver amplifier stage 32, low $k_m$ transformer (TRX) 34, driver amplifier stage 36, cross-connect splitter of the present invention 38, output amplifier stage 40, series combiner 42 and parallel combiner 44.

The PA 20 incorporates a three stage common-source pseudo-differential pair to compensate for the gain penalty $G_p$ of the class-E/F$_2$ operation in the last PA stage 40. A transformer-based power splitter 22 converts the singled-ended $S_{in}$ input 48 to two differential signals feeding pre-drivers 24. Another set of splitters 28 is added before the four parallel units of the output stage. A combination of series-parallel combining is used in the output matching network to generate the output signal $S_{out}$ 50. Two-way differential series combining 42 is achieved using a distributed active transformer 46 to reduce the resistive load seen by each transistor such that the systematic $P_{out}$ reduction of class-E/F$_2$ is partially compensated. By exploiting parallel combining, the output devices can be smaller for the same $P_{out}$, which effectively improves the transistors' internal loss and $f_{max}$. Hence, they can generate a stronger $2^{nd}$ harmonic current, which is beneficial for the class-E/F$_2$ operation.

Figure 4:
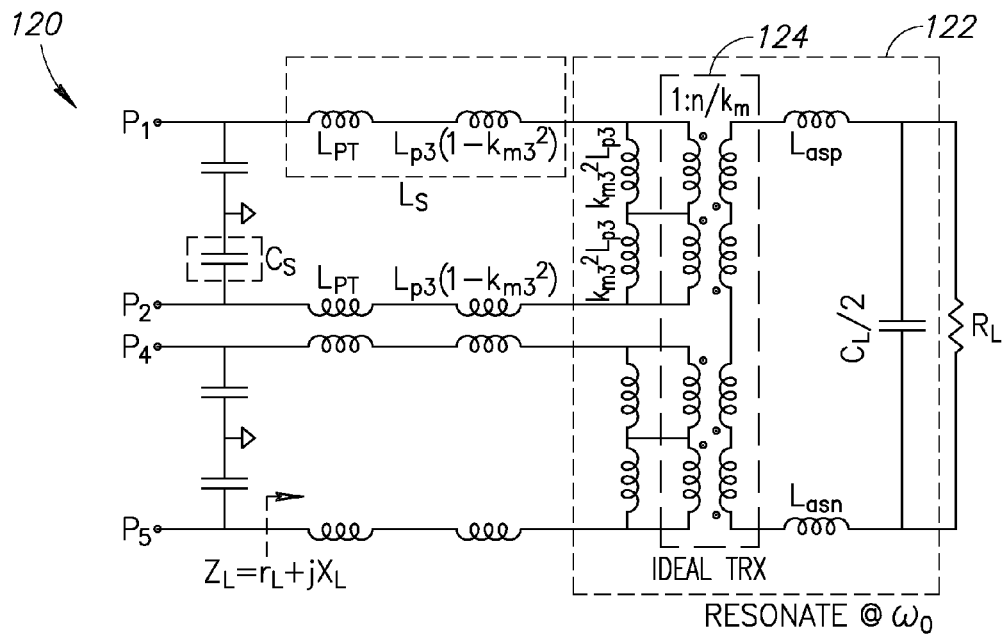
FIG. 4 is a schematic diagram illustrating an equivalent half-circuit model of the output matching network for differential mode (DM)
Figure 5:
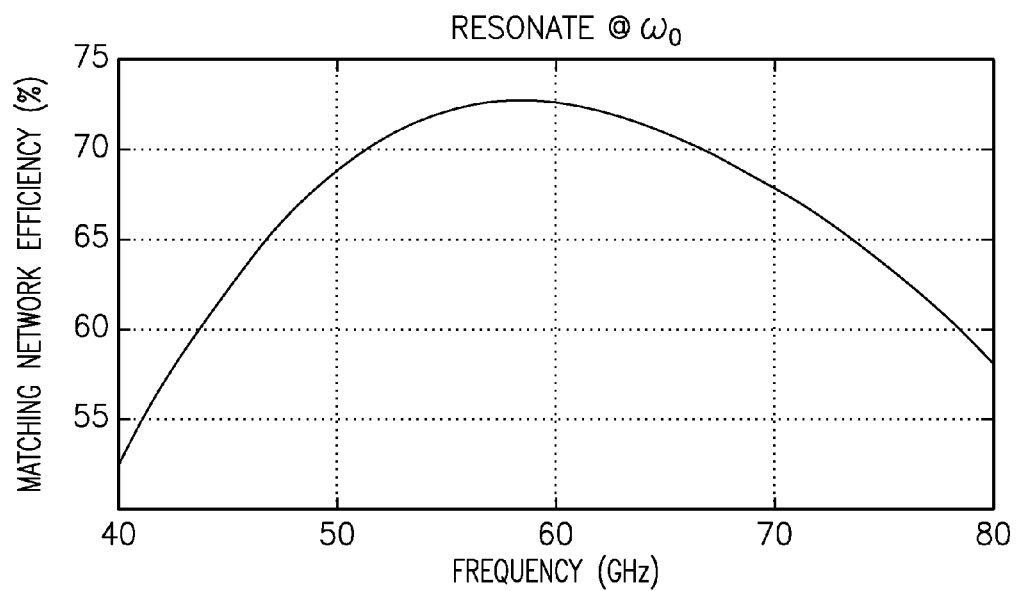
FIG. 5 is a graph illustrating matching network efficiency versus frequency.

A high level schematic diagram illustrating an equivalent half-circuit model of the output matching network for differential mode (DM) is shown in FIG. 4. Circuit block 122 includes an ideal transformer (TRX) 124 and resonates at the fundamental frequency $\omega_0$. A graph illustrating matching network efficiency versus frequency is shown in FIG. 5. The total effective inductance at the output of the matching network $(4L_{s3}+L_{asn}+L_{asp})/2$ must resonate with the parasitic capacitance of the pad ($C_L$) to optimize its insertion loss. Furthermore, the combination of the transformer leakage inductance $L_{p3}(1-k_{m3}^2)$ and the effective inductance of differential strip-lines $L_{PT}$ along $C_S$ must satisfy zero-voltage and zero-slope class-E switching criteria by:

$$(L_{p3}(1-k_{m3}^2)+L_{PT})C_S=1/4.74\omega_0^2 \quad (12)$$

Figure 6:
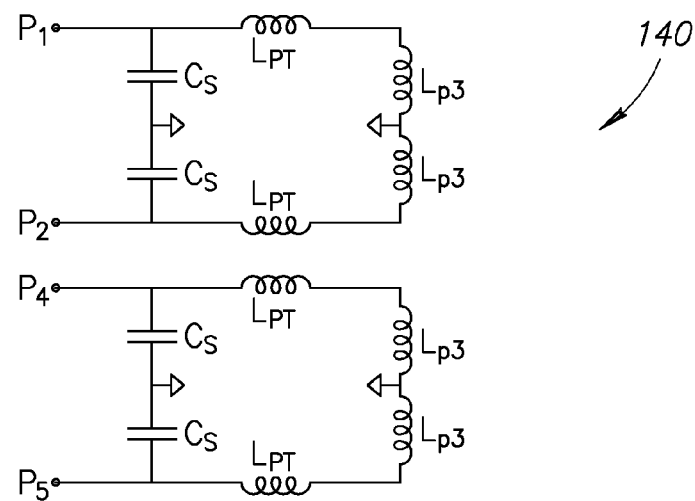
FIG. 6 is a high level schematic diagram illustrating an equivalent half-circuit model of the output matching network for common mode (CM)
Figure 7:
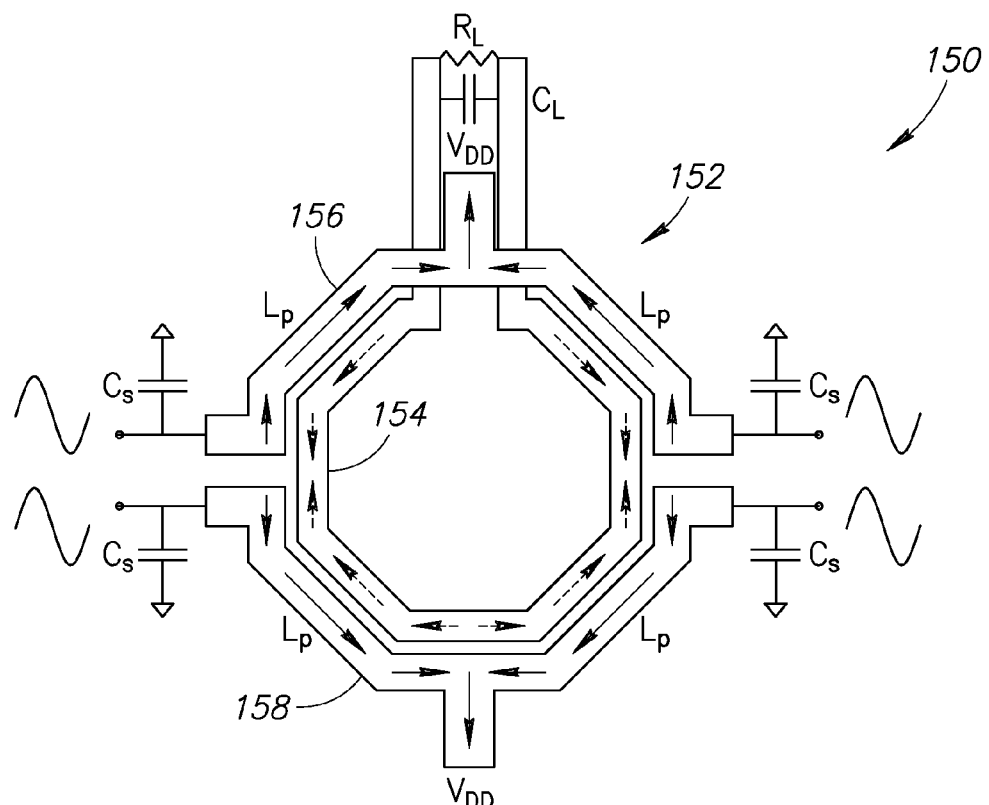
FIG. 7 is a diagram illustrating the current flow in the primary and secondary of the output matching network transformer for CM signals.
Figure 8:
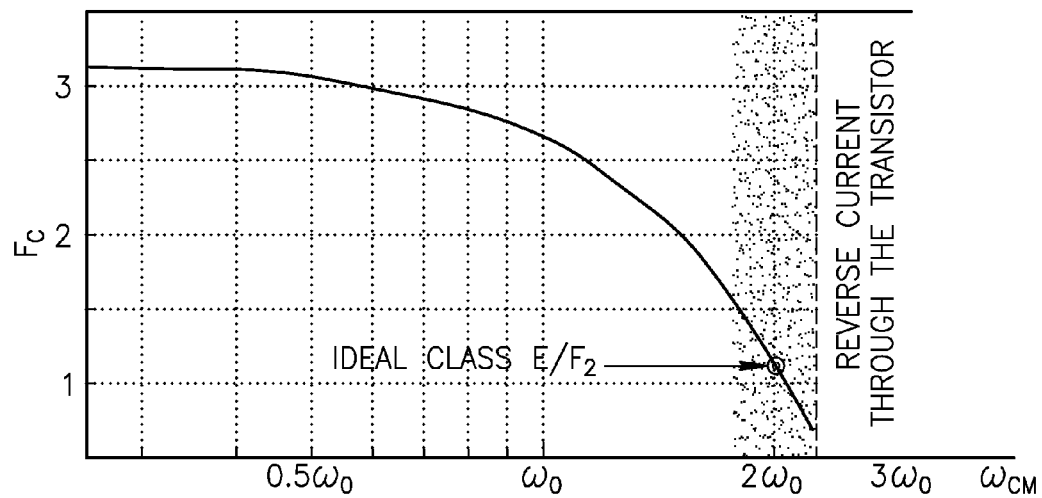
FIG. 8 is a graph of $F_c$ versus CM resonant frequency.

A high level schematic diagram illustrating an equivalent half-circuit model of the output matching network for common mode (CM) is shown in FIG. 6. It is important to note that the behavior of the impedance matching network is entirely different for common-mode (CM) input signals compared with that for DM signals. A diagram illustrating the current flow in the primary 156 and secondary 154 of the output matching network transformer 152 for CM signals is shown in FIG. 7. The transformer coupling factor $k_m$ is negligible in CM excitation and thus $R_L$, $C_L$ and $L_{s3}$ cannot be seen by even harmonics. Hence, the transmission line and transformer primary inductance, which is seen by CM signals, has to resonate with $C_S$ at the second harmonic $2\omega_0$ to satisfy class-E/F$_2$ operation. The graph of $F_c$ versus CM resonant frequency of FIG. 8 indicates that $F_c$ is just slightly degraded when CM resonance lies 25% away from $2\omega_0$. Thus, the PA is quite insensitive to the precise CM inductance value, which facilitates a wide bandwidth operation.

Figure 9:
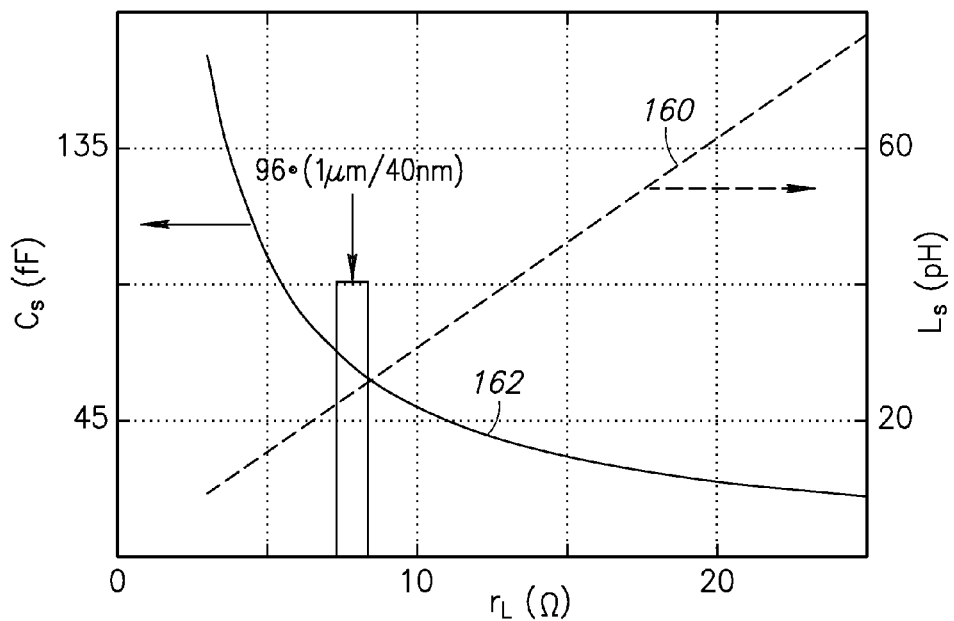
FIG. 9 is a graph illustrating the required $L_S$ and $C_S$ for class-E/F operation versus resistive load seen by the switch transistor.

A graph illustrating the required $L_S$ and $C_S$ for class-E/F operation versus resistive load seen by the switch transistor is shown in FIG. 9. The graph shows the optimum required class-E/F$_2$ PA shunt capacitance $C_S$ and series inductance $L_S$ at fundamental frequency versus the load resistance presented by the matching network. The matching network geometry design is initiated by choosing the switch transistor dimension such that its output capacitor absorbs the entire $C_S$. $C_S$, however, also depends on $L_S$ and the load resistance presented by the matching network, as can be gathered from FIG. 9. Hence, several iterations are needed to find the optimal size combination of the transistor, transformer and matching network. This procedure results in an optimal unit power transistor size of 96 (1 µm/40 nm) with 1.3 dB insertion loss of the output matching network. Note that the class-E/F$_2$ optimal combination is different from the goal of maximizing the output power or gain.

With reference to FIG. 3, two transistor based power splitters along with additional series inductance and a differential strip-line are respectively added at the input of the pre-driver 32 and driver 36 stages to feed differential pairs and provide their required source reactance.

Figure 10:
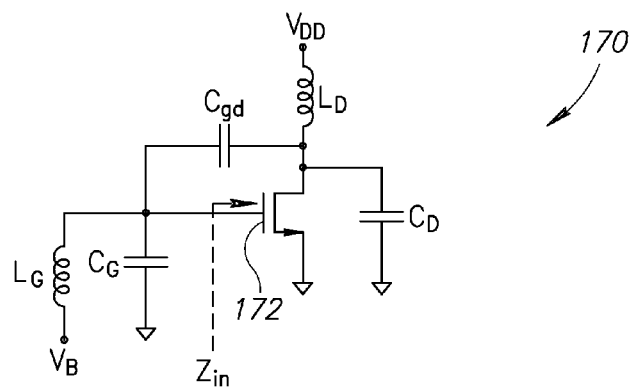
FIG. 10 is a schematic diagram illustrating the half-circuit of the PA pseudo-differential stage.

A schematic diagram illustrating the half-circuit of the PA pseudo-differential stage is shown in FIG. 10. Each pseudo-differential pair along with their parasitic capacitance $C_{gd}$ and matching networks can potentially act as two coupled Pierce oscillators and create CM instability. It can be shown that its resonant frequency is very close to the operating frequency ($\approx 0.7$-$0.8\omega_0$) such that neither (1) adding an RC stabilization network at the MOS gate nor (2) matching network loss can dampen the oscillation without affecting the precious power gain at $\omega_0$. Fortunately, using relatively large resistors ($R_B \sim 3$ k$\Omega$) between the center tap of the secondary windings of the input and inter-stage transformers and gate bias voltage can cancel out the CM currents at the transformer secondary winding. Hence, any CM oscillation will be dampened. Nevertheless, a combination of CM and differential mode (DM) oscillation can potentially happen in the transformer splitter, i.e. cross-connect splitter 28 (FIG. 1).

Figure 11:
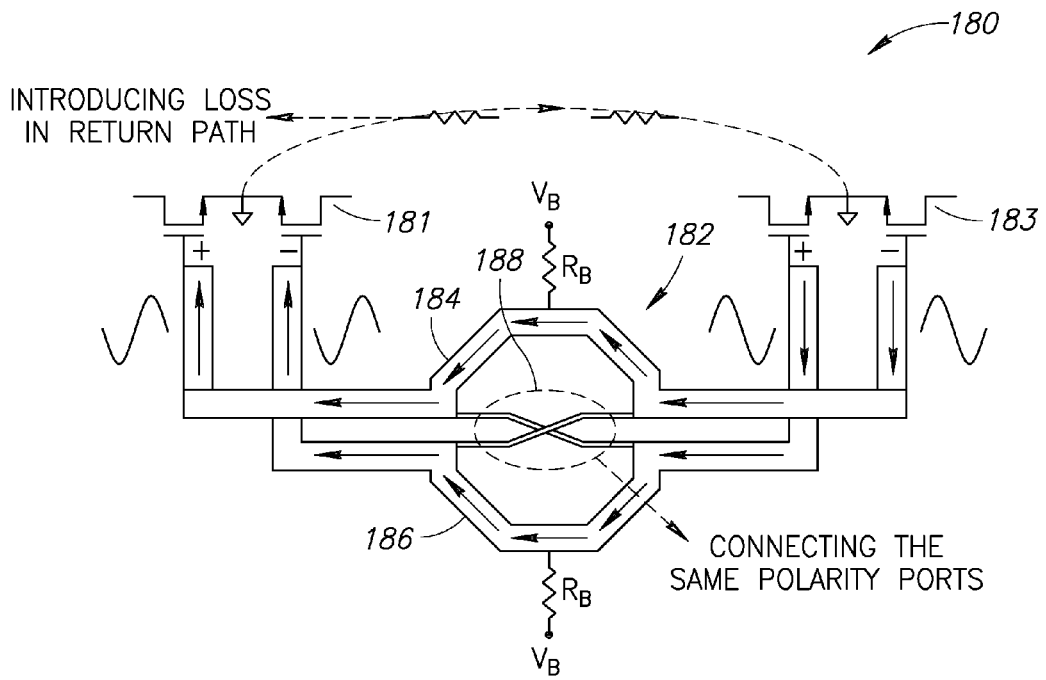
FIG. 11 is a schematic diagram illustrating an example cross-connect transformer splitter of the present invention.

A schematic diagram illustrating an example cross-connect transformer splitter of the present invention is shown in FIG. 11. The well-known neutralization technique can be used to improve DM stability and gain sensitivity to the load impedance. The PA is stabilized for CM oscillation by use of relatively large resistors (e.g., $R_B \sim 3$ k$\Omega$) between the center tap of the secondary windings of the transformers and gate bias voltage. Thus, the CM currents are canceled out at the transformer secondary and CM oscillation is dampened. A parallel RC network (e.g., 51$\Omega$∥144 fF) is also added at the input of the first stage to introduce resistive loss at lower frequencies. Nevertheless, a combination of CM and DM oscillation can potentially occur in the transformer splitter. As shown, each differential pair 181, 183 coupled to the transformer splitter 182 could oscillate in CM but with 180° phase shift to each other. Hence, neither neutralization capacitors nor $R_B$ will damp this oscillation. The present invention provides a solution by adding a relatively weak cross connection 188 between the splitter's in-phase ports to reduce the loop gain of this oscillation mode without affecting the splitter's main function. In another solution, a lossy path is added between the ground connections of two pseudo-differential pairs across the splitter. In one embodiment, the width of the added cross connection is preferably at least four times narrower than the main metal line of the splitter. It is appreciated, however, that the invention it not limited to the cross connection disclosed herein and can be modified depending on the particular implementation.

Figure 12:
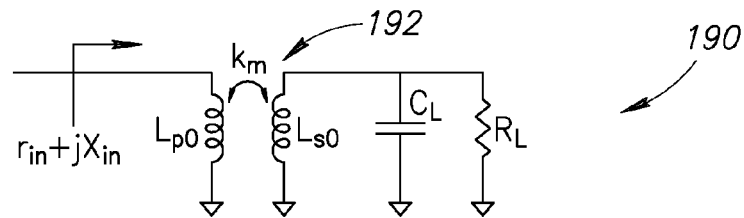
FIG. 12 is a half-circuit schematic diagram illustrating the transformer for inter-stage matching.
Figure 13:
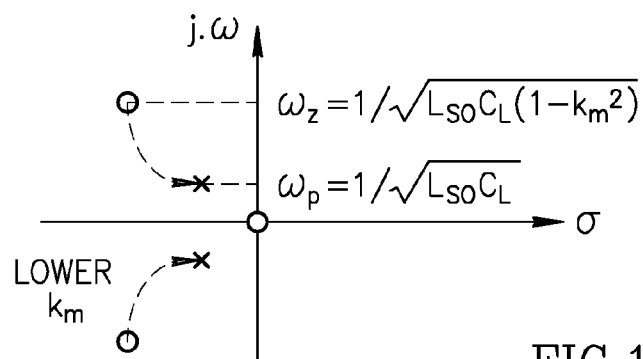
FIG. 13 is a schematic diagram illustrating illustrates the position of zeros and poles of the $X_{in}$ transfer function
Figure 14:
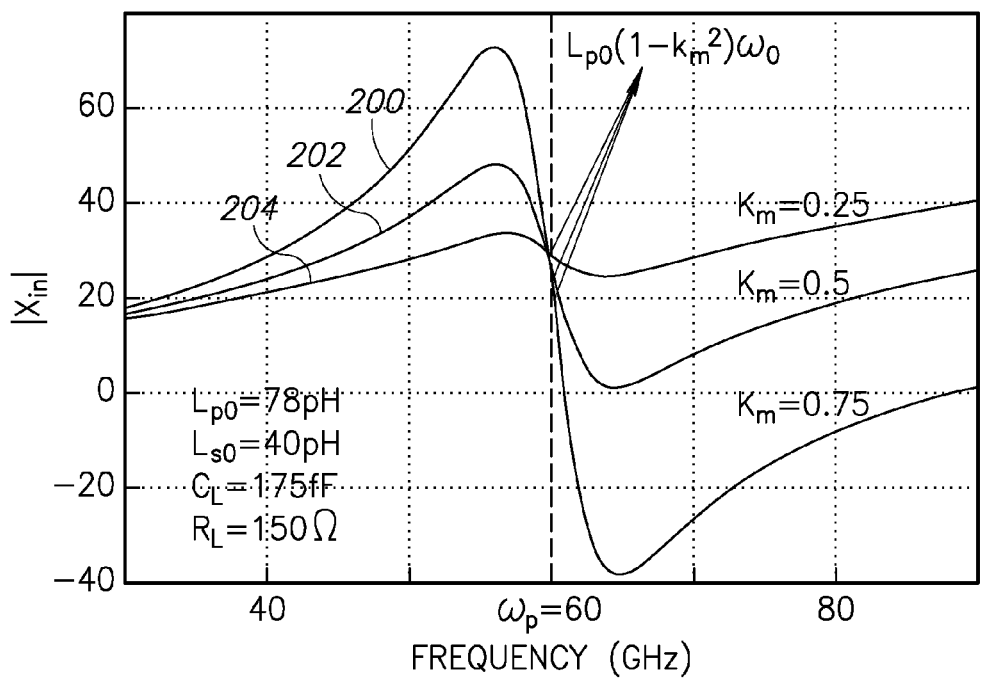
FIG. 14 is a graph illustrating $X_{in}$ versus frequency for different values of $k_m$.

The effective Q-factor of the PA input/output matching network is degraded by the 50$\Omega$ load and RF pad parasitic capacitance, $C_L \leq 50$ fF, to about 1 to 2 at 60 GHz, thus making these networks wideband. The input impedance of MOS transistors, however, is considered as load to the inter-stage matching network, where Qeff=$\overline{R_{in}C_{in}}\omega_0 \approx 60$ GHz. Hence, the impedance seen at the input of the transformer network ($r_{in}$+$jX_{in}$ in FIG. 12) changes significantly over frequency and thus limits the bandwidth of the PA. FIG. 13 illustrates the position of zeros and poles of the $X_{in}$ transfer function. In the case of a high $k_m$ ($\geq 0.7$), the conjugate zeros pair occurs at much higher frequency than the poles of the system. Hence, a large variation is seen in $X_{in}$, as shown in FIG. 14 where trace 200 represents $X_{in}$ for $k_m$=0.75; trace 202 represents $X_{in}$ for $k_m$=0.5; trace 204 represents $X_{in}$ for $k_m$=0.25. The zero/pole pairs, however, come closer together with lower $k_m$ resulting in a flatter region being observed in the $X_{in}$ plot. Hence, the transistor sees its desired impedance over a wider frequency range. The additional insertion loss penalty is only $\leq 1.5$ dB over the bandwidth by using a $k_m$=0.25 transformer. That penalty happens at the primary stages where it has a negligible effect on the total PAE.

Performance Results

Figure 15A:
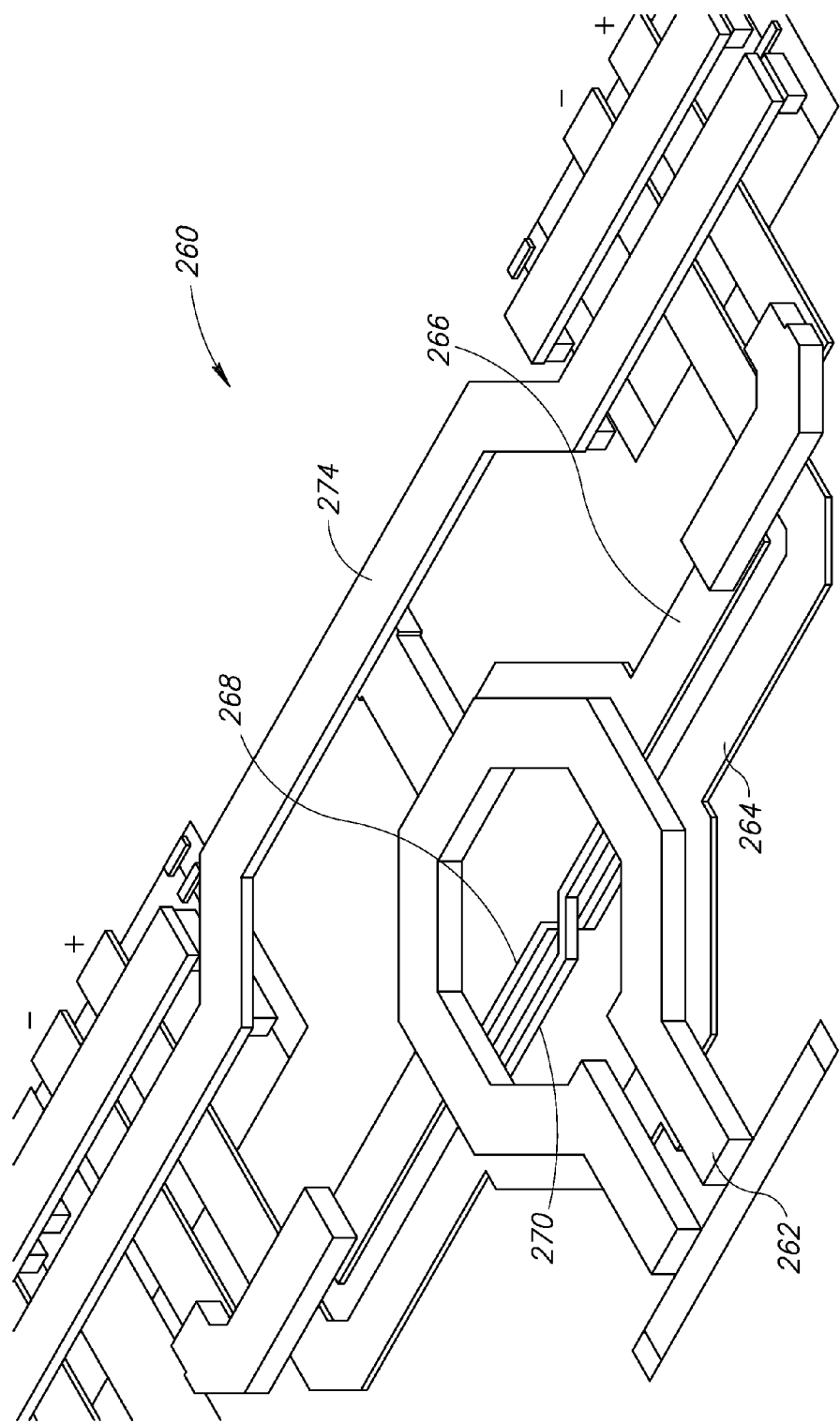
FIG. 15A is a layout diagram illustrating a top view of the splitter portion of the present invention.
Figure 15B:
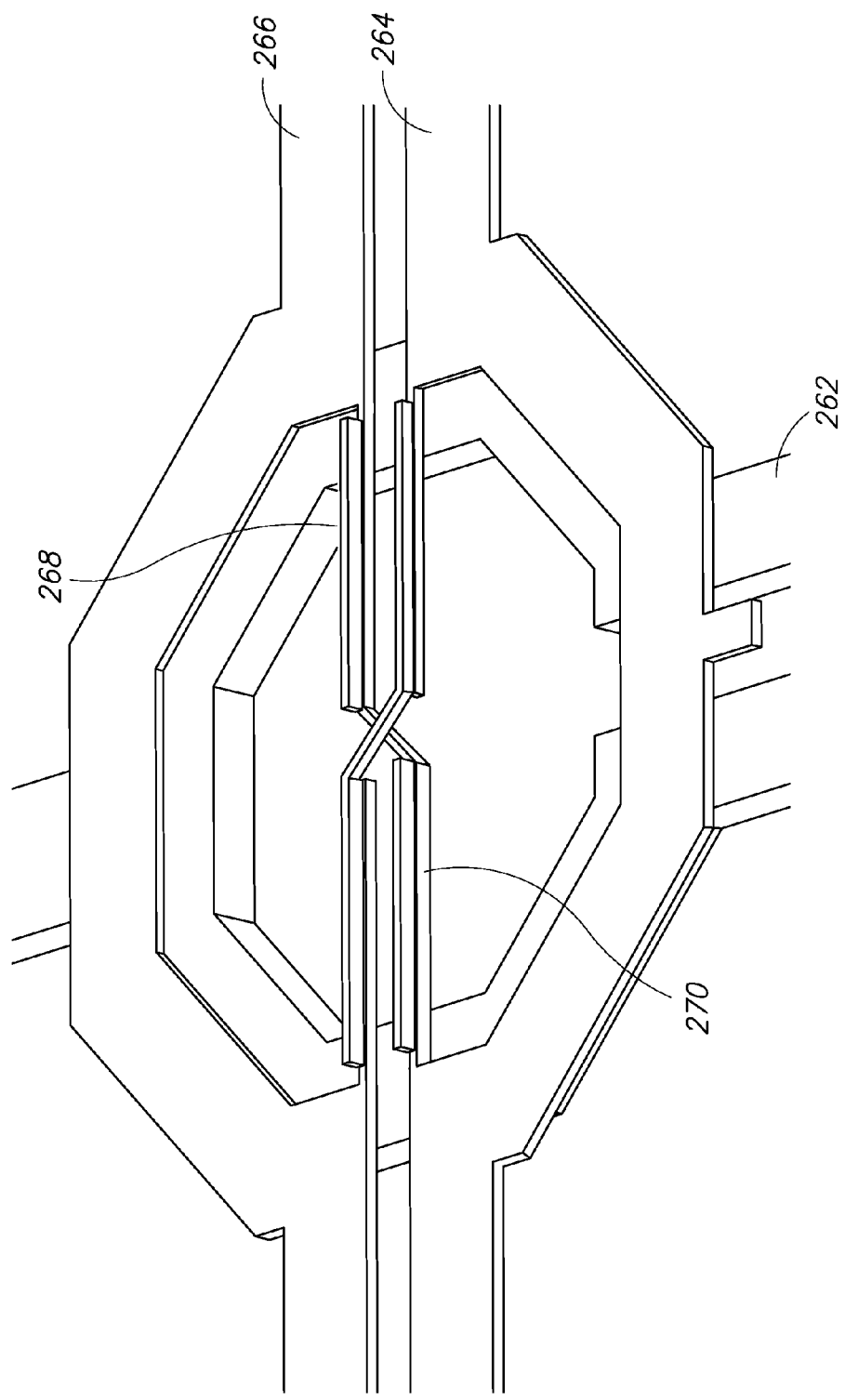
FIG. 15B is a layout diagram illustrating a bottom view of the splitter portion of the present invention.

The mm-wave power amplifier of the present invention has been fabricated in an integrated circuit using 40 nm 1.1V CMOS technology. A layout diagram illustrating a top view of the splitter portion of the present invention is shown in FIG. 15A. A layout diagram illustrating a bottom view of the splitter portion of the present invention is shown in FIG. 15B. The circuit, generally referenced 260, comprises the primary winding 262 of the splitter, first secondary winding 266, second secondary winding 264, a connection 270 connecting the positive polarity ports of the secondary windings 264, 266, a connection 268 connecting the negative polarity ports of the secondary windings 264, 266 and $V_{DD}$ trace 274.

In one embodiment, the transformers comprising the PA are completely filled with dummy metal strips to comply with the strict metal density rules. The amount of the metal fills right underneath the transformer windings is kept at minimum to reduce the extra parasitic capacitance and eddy current losses. Electromagnetic simulations, however, reveal an additional loss of 0.2 to 0.4 dB for each matching network.

Figure 16:
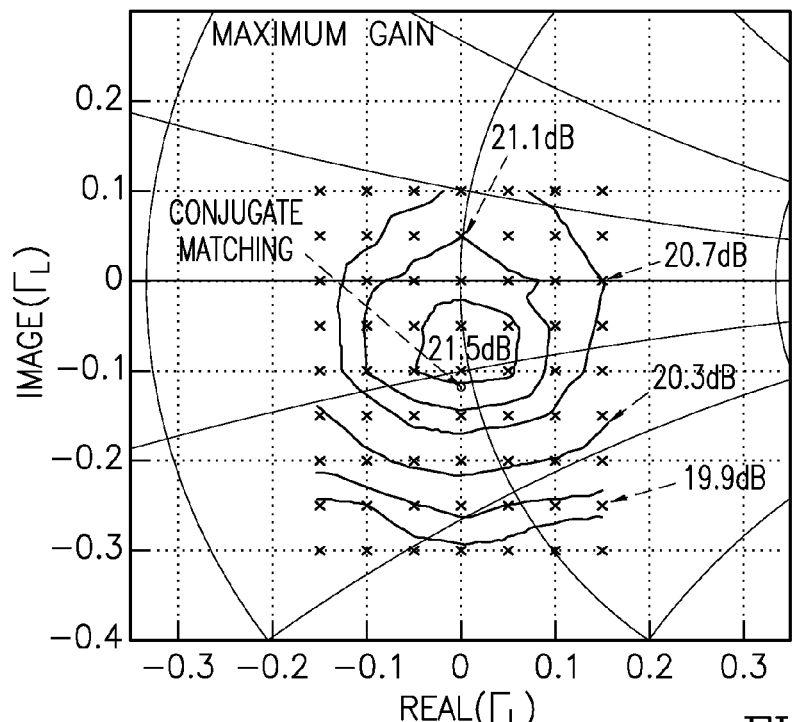
FIG. 16 is a graph illustrating measured constant maximum gain contours.
Figure 17:
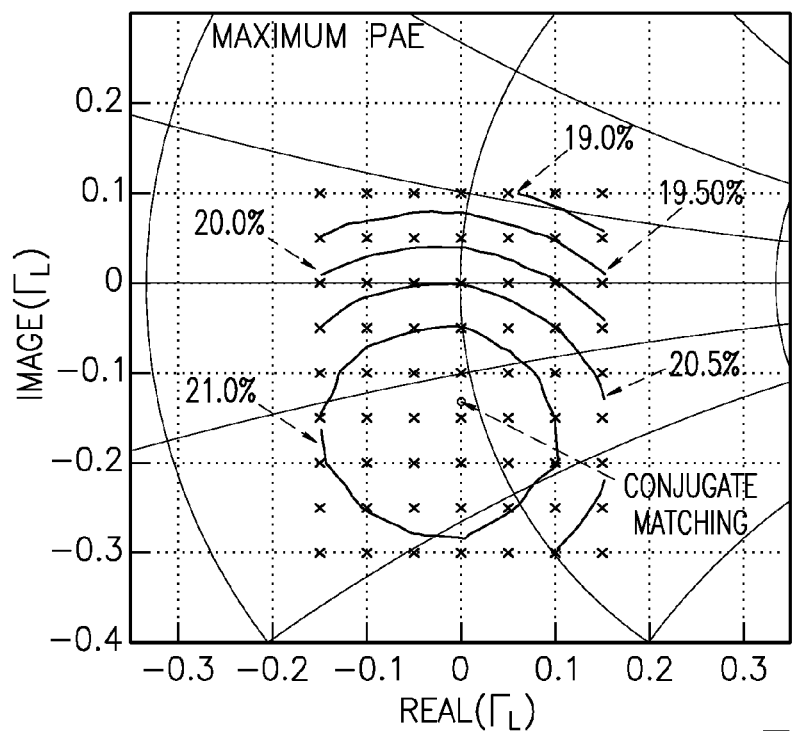
FIG. 17 is a graph illustrating measured constant PAE contours.

With a 1 V supply, the PA achieves a peak power gain of 21.6 dB at 58 GHz with a 3 dB bandwidth of 9.7 GHz (i.e. 51.5 to 61.2 GHz). The $S_{11}$, $S_{22}$ and $S_{12}$ are respectively better than −6, −7 and −42 dB within 50 to 67 GHz. The large-signal measurements were performed by a mixed-signal active load-pull setup. Consuming $\leq 0.3$ A from a 1 V supply, the measured $P_{1dB}$ and $P_{sat}$ are respectively 14.9 dBm and 17.9 dBm with 20.5% PAE. at 60 GHz. The following parameters are maintained over 52 to 63 GHz: 16.9 dBm $P_{sat}$, 13.8 dBm $P_{1dB}$, and 16% PAE. FIGS. 16 and 17 illustrate the constant gain and PAE contours of the power amplifier, respectively, and also verifies its stability over load variation.

Mobile Device Incorporating the Power Amplifier

Figure 18:
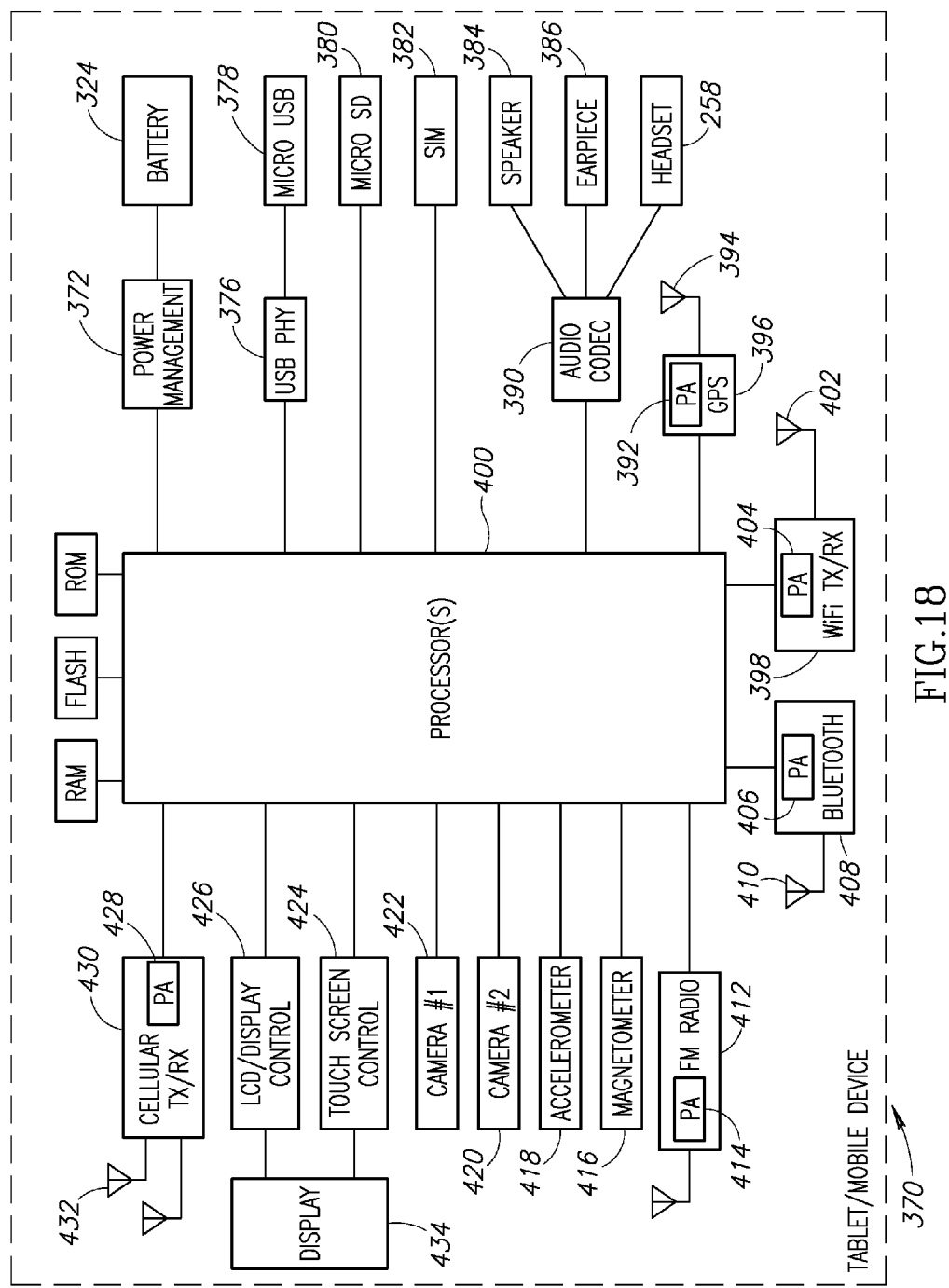
FIG. 18 is a block diagram illustrating an example mobile device incorporating the power amplifier of the present invention.

A block diagram illustrating an example tablet/mobile device incorporating the power amplifier of the present invention is shown in FIG. 18. The mobile device is preferably a two-way communication device having voice and/or data communication capabilities. In addition, the device optionally has the capability to communicate with other computer systems via the Internet. Note that the mobile device may comprise any suitable wired or wireless device such as multimedia player, mobile communication device, digital still or video camera, cellular phone, smartphone, iPhone, PDA, PNA, Bluetooth device, tablet computing device such as the iPad or other iOS device, Android device, Surface, Nexus, Google Glass, etc. For illustration purposes only, the device is shown as a mobile device, such as a cellular based telephone, smartphone or superphone. Note that this example is not intended to limit the scope of the mechanism as the invention can be implemented in a wide variety of communication devices. It is further appreciated the mobile device shown is intentionally simplified to illustrate only certain components, as the mobile device may comprise other components and subsystems beyond those shown.

The mobile device, generally referenced 370, comprises one or more processors 400 which may comprise a baseband processor, CPU, microprocessor, DSP, etc., optionally having both analog and digital portions. The mobile device may comprise a plurality of cellular radios 430 and associated antennas 432. Radios for the basic cellular link and any number of other wireless standards and Radio Access Technologies (RATs) may be included. Examples include, but are not limited to, Third Generation (3G) Long Term Evolution (LTE), Code Division Multiple Access (CDMA), Personal Communication Services (PCS), Global System for Mobile Communication (GSM)/GPRS/EDGE 3G; WCDMA; WiMAX for providing WiMAX wireless connectivity when within the range of a WiMAX wireless network; Bluetooth for providing Bluetooth wireless connectivity when within the range of a Bluetooth wireless network; WLAN for providing wireless connectivity when in a hot spot or within the range of an ad hoc, infrastructure or mesh based wireless LAN (WLAN) network; near field communications; UWB; GPS receiver for receiving GPS radio signals transmitted from one or more orbiting GPS satellites, FM transceiver provides the user the ability to listen to FM broadcasts as well as the ability to transmit audio over an unused FM station at low power, such as for playback over a car or home stereo system having an FM receiver, digital broadcast television, etc.

The mobile device may also comprise internal volatile storage 436 (e.g., RAM) and persistent storage 440 (e.g., ROM) and flash memory 438. Persistent storage 436 also stores applications executable by processor(s) 400 including the related data files used by those applications to allow device 370 to perform its intended functions. Several optional user-interface devices include trackball/thumbwheel which may comprise a depressible thumbwheel/trackball that is used for navigation, selection of menu choices and confirmation of action, keypad/keyboard such as arranged in QWERTY fashion for entering alphanumeric data and a numeric keypad for entering dialing digits and for other controls and inputs (the keyboard may also contain symbol, function and command keys such as a phone send/end key, a menu key and an escape key), headset 388, earpiece 386 and/or speaker 384, microphone(s) and associated audio codec 390 or other multimedia codecs, vibrator for alerting a user, one or more cameras and related circuitry 420, 422, display(s) 434 and associated display controller 426 and touchscreen control 424. Serial ports include a micro USB port 378 and related USB PHY 376 and micro SD port 380. Other interface connections may include SPI, SDIO, PCI, USB, etc. for providing a serial link to a user's PC or other device. SIM/RUIM card 382 provides the interface to a user's SIM or RUIM card for storing user data such as address book entries, user identification, etc.

Portable power is provided by the battery 374 coupled to power management circuitry 372. External power is provided via USB power or an AC/DC adapter connected to the power management circuitry that is operative to manage the charging and discharging of the battery. In addition to a battery and AC/DC external power source, additional optional power sources each with its own power limitations, include: a speaker phone, DC/DC power source, and any bus powered power source (e.g., USB device in bus powered mode).

Operating system software executed by the processor 400 is preferably stored in persistent storage (i.e. ROM 440), or flash memory 438, but may be stored in other types of memory devices. In addition, system software, specific device applications, or parts thereof, may be temporarily loaded into volatile storage 436, such as random access memory (RAM). Communications signals received by the mobile device may also be stored in the RAM.

The processor 400, in addition to its operating system functions, enables execution of software applications on the device 370. A predetermined set of applications that control basic device operations, such as data and voice communications, may be installed during manufacture. Additional applications (or apps) may be downloaded from the Internet and installed in memory for execution on the processor. Alternatively, software may be downloaded via any other suitable protocol, such as SDIO, USB, network server, etc.

Other components of the mobile device include an accelerometer 418 for detecting motion and orientation of the device, gyroscope 417 for measuring or maintaining orientation, magnetometer 416 for detecting the earth's magnetic field, FM radio 412 and antenna 413, Bluetooth radio 408 and antenna 410, Wi-Fi radio 398 including antenna 402 and GPS 392 and antenna 394.

In accordance with the invention, the mobile device 370 comprises one or more PA circuits, each incorporating the power amplifier circuit of the present invention described in detail supra. Numerous embodiments of the mobile device 370 may comprise a PA circuit 428 as described supra incorporated in the one or more cellular radios 430; a PA circuit 414 as described supra incorporated in the FM radio 412; a PA circuit 406 as described supra incorporated in the Bluetooth radio 408; a PA circuit 404 as described supra incorporated in the Wi-Fi radio 398; and a PA circuit 396 as described supra incorporated in the GPS radio 392.

Internet of Things (IoT) Node

Incorporating the Power Amplifier

The Internet of Things (IoT) is defined as the network of physical objects or "things" embedded with electronics, software, sensors and network connectivity, which enables these objects to collect and exchange data. The IoT allows objects to be sensed and controlled remotely across existing network infrastructure, creating opportunities for more direct integration between the physical world and computer-based systems, and resulting in improved efficiency, accuracy and economic benefit. Each thing is uniquely identifiable through its embedded computing system but is able to interoperate within the existing Internet infrastructure. Experts estimate that the IoT will consist of almost 50 billion objects by 2020.

Figure 19:
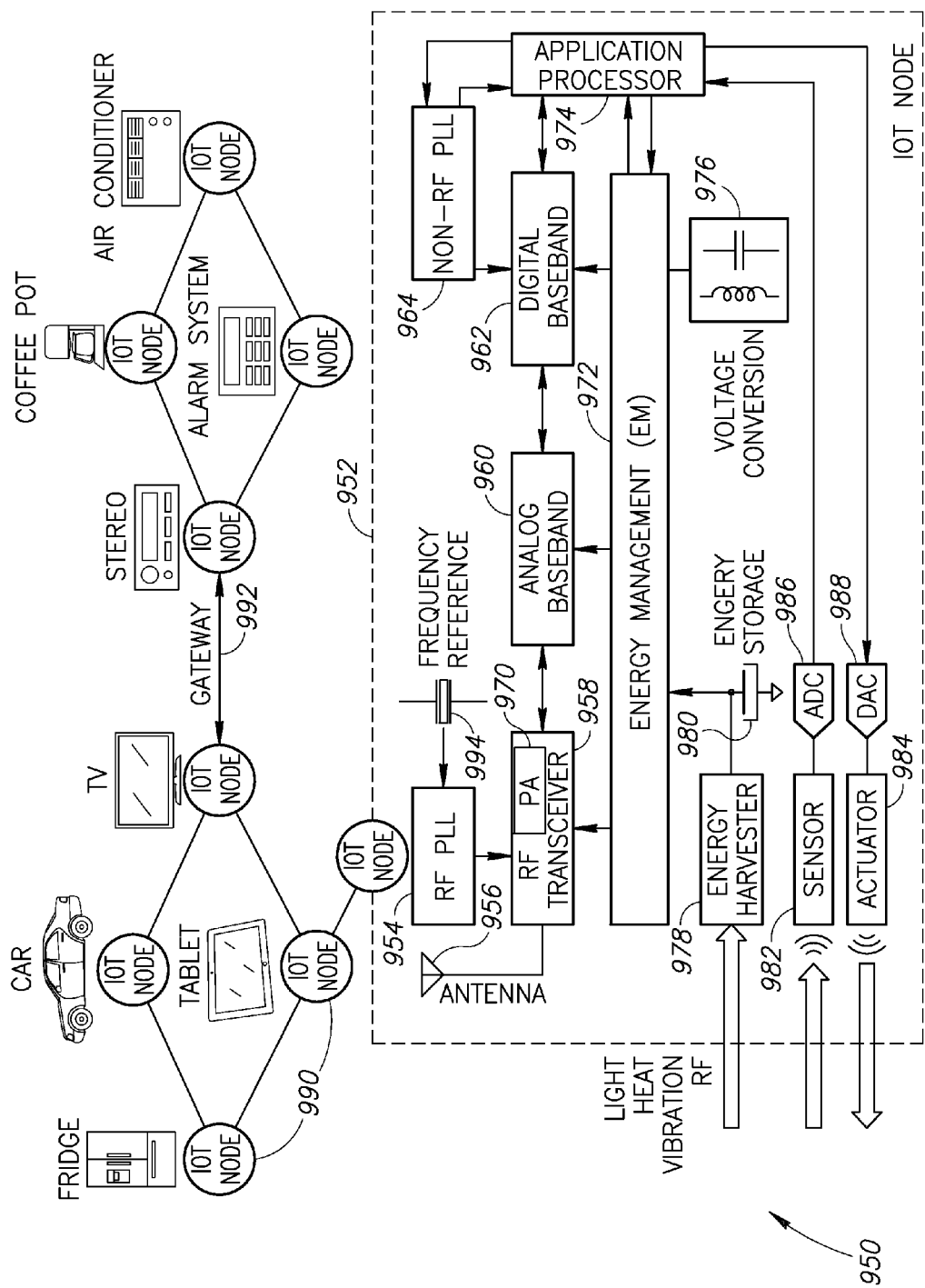
FIG. 19 is a block diagram illustrating an example IoT node incorporating the oscillator/frequency generator of the present invention.

A block diagram illustrating an example IoT node incorporating the oscillator/frequency generator of the present invention is shown in FIG. 19. The example IoT, generally referenced 950, comprises a plurality of nodes 990. The architecture of an example IoT node 952 shown can be fully integrated as a System on Chip (SoC) on a single IC chip in nanoscale CMOS. It contains the radio subsystem to wirelessly communicate with other nodes and gateways 992, application processor to impart a certain amount of local "intelligence", sensor and an optional actuator to interface with the environment and energy management to harvest energy (light, heat, vibration or RF power) from the environment and/or convert the voltage levels to those required by the functional circuitry. The RF and non-RF frequency synthesizers provide local oscillator and processor clocks, respectively. A frequency reference 994 provides a fixed clock with excellent long term stability to the frequency synthesizers. In one embodiment, the power amplifier of the present invention described supra is incorporated in the RF transceiver 958 as circuit block 970.

The RF transceiver 958 interfaces with an antenna 956. The RF signals are upconverted and downconverted there to the lower (i.e. baseband) frequencies, which are then processed in the analog baseband circuitry. The conversion from analog to digital (i.e. ADC), and vice versa (i.e. DAC), is also performed there. The digital baseband completes the physical layer of a chosen communication standard. The application processor performs various control and signal processing functions and is responsible for giving a level of "intelligence" to the IoT node.

The RF frequency synthesizer 954 is realized as an all-digital PLL (ADPLL) and provides a local oscillator signal to the RF transceiver 958. The non-RF frequency synthesizer 964 provides clocks to the digital baseband 962 and application processors 974. The clock frequency has to be dynamically switchable in response to the changing computational load conditions. The energy management (EM) circuitry 972 provides energy conversion between the energy harvester 978 and/or low-capacity storage battery 980 and all the IoT functional circuits. The EM circuit carries out several functions. First, it boosts the voltage from the energy harvester (e.g., light, heat, vibration, RF electromagnetic, etc.) to that required by the nanoscale CMOS circuits, which is in the range of 0.7 to 1.0 V assuming 40 nm CMOS technology. This is performed by a dedicated DC-DC boost converter 976. Second, it down-shifts the energy from a battery, which is on the order of 1.5 to 3.6 V to that required by the nanoscale CMOS circuits. This is performed by a dedicated DC-DC buck converter 976. Third, both boost and buck converters use energy storage passive devices, i.e. capacitor or inductor for storing electrical and magnetic energy, respectively, in order to change the voltage level with high efficiency. The high conversion efficiency must be maintained across the entire range of the allowed loads. Fourth, the EM needs to provide many power supply domains. This is dictated by the different voltage level requirements during voltage scaling. Fifth, the EM supply domains preferably provide individually adjustable voltage levels. The supply voltage level of digital logic circuits widely vary depending on the fast changing real time computational load conditions, while the voltage level of digital RF and analog circuits experience less of such variance, and mainly due to temperature and operating frequency, as well as communication channel conditions. Moreover, the analog circuits have to be properly biased, which normally prevents them from operating at near-threshold conditions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A radio frequency (RF) signal splitter, comprising:
  a transformer having:
    a primary winding coupled to a differential input signal source;
    a first secondary winding configured to generate a first differential output signal;
    a second secondary winding configured to generate a second differential output signal; and
    a cross-connect configured to couple said first secondary winding to said second secondary winding.

2. The signal splitter according to claim 1, wherein said cross connection is placed between in-phase ports of said first and second secondary windings.

3. The signal splitter according to claim 1, wherein said cross connection is operative to reduce loop gain of a combination of differential mode and common mode oscillations.

4. The signal splitter according to claim 1, wherein said cross connection does not affect normal operation of said splitter.

5. The signal splitter according to claim 1, wherein said cross connection is operative to introduce signal loss in a return of said first and second differential output signals.

6. A radio frequency (RF) signal splitter, comprising:
  a transformer having:
    a primary winding coupled to a differential input signal source;
    a first secondary winding configured to generate a first differential output signal having a first polarity port and an opposite second polarity port;
    a second secondary winding configured to generate a second differential output signal having a first polarity port and an opposite second polarity port;
    a cross-connection configured to couple the first polarity port of said first secondary winding to the first polarity port of said second secondary winding, and to couple the second polarity port of said first secondary winding to the second polarity port of said second secondary winding;
    wherein said cross-connection is operative to dampen combined common mode and differential mode oscillations present on said first and second secondary windings.

7. The signal splitter according to claim 6, wherein said cross connection comprises a relatively weak electrical connection.

8. The signal splitter according to claim 6, wherein said cross connection is placed between in-phase ports of said first and second secondary windings.

9. The signal splitter according to claim 6, wherein said cross connection is operative to reduce loop gain of a combination of differential mode and common mode oscillations.

10. The signal splitter according to claim 6, wherein said cross connection does not affect normal operation of said splitter.

11. The signal splitter according to claim 6, wherein said cross connection is operative to introduce signal loss in a return of said first and second differential output signals.

12. A class $E/F_2$ power amplifier, comprising:
one or more switch transistors;
a signal splitter including a first transformer, said first transformer comprising:
  a primary winding coupled to a differential input signal source;
  a first secondary winding configured to generate a first differential output signal;
  a second secondary winding configured to generate a second differential output signal;
  a cross-connect configured to couple said first secondary winding to said second secondary winding;
an impedance matching network coupled to an output of said splitter, said impedance matching network comprising:
  a second transformer, said second transformer comprising:
    a primary winding having a first inductance;
    a secondary winding having a second inductance;
  wherein said secondary inductance and its associated capacitance are configured to resonate at a fundamental frequency; and
  wherein exciting said primary winding with a common mode signal at a second harmonic frequency causes substantially no current to be induced on said secondary winding.

13. The power amplifier according to claim 12, wherein said cross connection is placed between in-phase ports of said first and second secondary windings.

14. The power amplifier according to claim 12, wherein said cross connection is operative to reduce loop gain of a combination of differential mode and common mode oscillations.

15. The power amplifier according to claim 12, wherein said cross connection does not affect normal operation of said splitter.

16. The power amplifier according to claim 12, wherein said cross connection is operative to introduce signal loss in a return of said first and second differential output signals.

* * * * *